United States Patent [19]

McAulay

[11] Patent Number: 5,285,411
[45] Date of Patent: Feb. 8, 1994

[54] METHOD AND APPARATUS FOR OPERATING A BIT-SLICE KEYWORD ACCESS OPTICAL MEMORY

[75] Inventor: Alastair D. McAulay, Centerville, Ohio

[73] Assignee: Wright State University, Dayton, Ohio

[21] Appl. No.: 716,098

[22] Filed: Jun. 17, 1991

[51] Int. Cl.$^5$ ............................................. G11C 15/00
[52] U.S. Cl. ...................... 365/49; 365/106; 365/215; 365/216; 365/234
[58] Field of Search ............... 365/49, 106, 215, 216, 365/234

[56] References Cited

U.S. PATENT DOCUMENTS

| | | | |
|---|---|---|---|
| 3,704,929 | 12/1972 | Sakaguchi et al. | 365/49 |
| 3,868,655 | 2/1975 | Filippazzi | 365/49 |
| 4,703,993 | 11/1987 | Hinton et al. | 350/3.72 |
| 4,750,153 | 6/1988 | Owechko et al. | 365/49 |
| 4,842,370 | 6/1989 | Brenner et al. | 350/321 |
| 4,977,540 | 12/1990 | Goodwin et al. | 365/49 |
| 5,131,055 | 7/1992 | Chao | 365/49 |

OTHER PUBLICATIONS

McAulay, Alastair D., "Spatial-Light-Modulator Interconnected Computers", Reprinted from Computer, pp. 45–57, Oct. 1987.

*Primary Examiner*—Robert J. Pascal
*Assistant Examiner*—R. A. Ratliff
*Attorney, Agent, or Firm*—Killworth, Gottman, Hagan & Schaeff

[57] ABSTRACT

A method and apparatus operate an optical memory to perform bit-slice associative memory operations by storing a plurality of keywords to define a keyword database and accessing the database by means of one of the keywords. Preferably, the plurality of keywords are unique and are used to retrieve data which corresponds individually to the keywords. Operation of the memory is by identification of a keyword, the location of which is to be determined within the memory, for example for data retrieval. The identified keyword is then used effectively as a retrieval mask to access the plurality of keywords. The keyword database and its complement are stored in an optical device with the keyword to be retrieved and its complement being stored in recall optical devices. The keyword database or its complement is repetitively swept by shifting output columnar vectors by one bit position until all bit positions have been swept. Only identical keywords stored in the memory will result in light output during the last sweep with the light output identifying the row or rows which contain the keyword to be retrieved. The optical paths can be reduced and/or the use of complements can be eliminated by means of dual-rail coding and polarization techniques.

24 Claims, 3 Drawing Sheets

METHOD AND APPARATUS FOR OPERATING A BIT-SLICE KEYWORD ACCESS OPTICAL MEMORY

U.S. GOVERNMENT RIGHTS

The U.S. Government has a paid-up license in this invention and the right in limited circumstances to require the patent owner to license others on reasonable terms as provided for by the terms of Grant No. AFOSR-89-0525 awarded by United States Air Force.

BACKGROUND OF THE INVENTION

The present invention relates generally to optical computing and data processing systems and, more particularly, to apparatuses and methods of operating an optical memory to perform bit-slice associative memory operations.

The advantages of optical techniques over electronics have long been recognized and have lead to extensive use of optical devices in communications. As the size and speed limitations inherent in present electronic technology are imposing limits on computer development in terms of size reduction and operating speeds, optical techniques are being investigated to overcome the limits. Ideally, optics would initially be added to existing computer systems to perform such operations as storage and intercommunications among multiple processors but in smaller packages and in higher speed devices. Ultimately, optics would substantially replace electronics for performing computational operations in addition to storage and communications.

Thus, there is a need for optical operating systems which can be used in hybrid electronic/optical computers and ultimately in all optical computers.

SUMMARY OF THE INVENTION

This need is met in the data storage and retrieval area by methods and apparatuses for operating an optical memory to perform bit-slice associative memory operations. Such memory operations are performed by storing a plurality of keywords to define a keyword database and accessing the database by means of one of the keywords. Preferably, the plurality of keywords are unique and are used to retrieve data which corresponds individually to the keywords. Operation of the memory is by identification of a keyword the location of which is to be determined within the memory, for example for data retrieval. The identified keyword is then used effectively as a retrieval mask to access the plurality of keywords.

While the plurality of keywords can be accessed in any order in a bit-slice manner, it is preferred to commence access at one end of the identified keyword and progresses to the other end bit-by-bit. The corresponding bit of the identified keyword will be transparent or opaque with a "1" being defined herein to be transparent and a "0" being defined herein to be opaque. Transparent bits of the identified keyword are used to sweep out corresponding columns of the keyword database and a complementary database and complementary identified keyword can be provided to sweep out corresponding columns of the complementary database for opaque bits of the identified keyword. The keyword database and identified keyword are aligned along a first optical path while the complementary keyword database and complementary keyword are aligned along a second optical path.

An initial light source is used to sweep out the first column of the keyword database through the identified keyword for an initial "1" or to sweep out the complementary keyword database through the complementary identified keyword for an initial "0". In any event, the two optical paths are merged such that a columnar pattern representative of the first bit-slice of the keyword database or its complement is presented at the output of the merged paths. A third optical path is provided to feed back columnar patterns from the first and second optical paths, but with the patterns shifted preferably by one or possibly by more than one bit location.

The shifted columnar patterns are then compressed to access the identified keyword whose location in the keyword database is being identified, or the complementary identified keyword, to generate corresponding columnar patterns for each of the bit locations of the plurality of keywords in the keyword database. Since the light source is suppressed or obscured for each row in which there is no match in either the keyword database or the complementary keyword database, only a perfect match will result in an output from the final column of the keyword database to be swept. Thus, the location or locations of the identified keyword within the plurality of keywords is identified.

Alternately, dual rail coding can be used where the keywords and keyword to be retrieved are stored in two-bit form with each bit being stored both in its true form and its complement form. Polarization techniques can also be used to eliminate the use of any complement operations.

In the preferred implementation wherein the plurality of keywords are unique, only one location is identified and that location identifier can be used to access data corresponding to the identified keyword. If an optical store, such as a holographic storage device, is used for the stored data, the data can be read out by the location identifier of the identified keyword.

In accordance with one aspect of the present invention, a method of operating an optical memory to perform bit-slice associative memory operations comprises the steps of: storing a plurality of keywords in storage means for optically storing the plurality of keywords; identifying a keyword to be retrieved from the storage means; illuminating a first bit-slice of the storage means in response to a corresponding first bit of the keyword to be retrieved to retrieve a corresponding bit-slice of the keywords stored in the storage means; shifting keyword bit-slices retrieved from the storage means and feeding the shifted bit-slices back to the storage means to illuminate all bit-slices of the optical storage means; and, identifying one or more locations of the optical storage means which contain the keyword to be retrieved from the final bit-slice retrieved from the optical storage means. The method may further comprise the step of accessing output data corresponding to the one or more locations of the storage means, for example by direct application of one or more optical readouts to a holographic store.

Preferably, the plurality of keywords stored in the storage means are unique such that only one location of the storage means is identified by the final keyword bit-slice retrieved from the storage means. The method may further comprise the step of accessing output data corresponding to the one location of the storage means. The step of illuminating a first bit-slice of the storage means is most easily performed by illuminating a first end bit-slice of the storage means and the step of shifting keyword bit-slices retrieved from the storage means and feeding the shifted bit-slices back to the storage means to illuminate all bit-slices of the optical storage means then comprises single bit-slice shifts toward a second end of the storage means. The storage means may comprise at least one spatial light rebroadcaster.

In accordance with another aspect of the present invention, a method of operating an optical memory to perform bit-slice associative memory operations comprises the steps of: optically storing a plurality of keywords; optically storing a plurality of keywords which are the complements of the plurality of keywords; optically storing a keyword to be retrieved from the plurality of keywords; optically storing a keyword which is the complement of the keyword to be retrieved from the plurality of keywords; optically aligning the keyword to be retrieved with the plurality of keywords along a first optical path; optically aligning the complement of the keyword with the complements of the keywords along a second optical path; illuminating the plurality of keywords through the keyword to be retrieved and the complement of the plurality of keywords through the complement of the keyword to be retrieved to generate bit-slice patterns representative of the combination of the keyword to be retrieved and the plurality of keywords; receiving the bit-slice patterns from the first and second optical paths and shifting the bit-slice patterns by one or more bit positions; and, directing shifted bit-slice patterns to the first and second optical paths until all bit positions of the plurality of keywords have been illuminated to identify one or more of the plurality of keywords as being the keyword to be retrieved.

The method may further comprise the step of accessing output data corresponding to the one or more keywords. Preferably, the plurality of keywords are unique such that only one of the keywords is identified and used to access output data corresponding to the one keyword.

In accordance with still another aspect of the present invention, a method of operating an optical memory to perform bit-slice associative memory operations comprises the steps of: optically storing a plurality of keywords, each bit of each of the keywords being stored as two bits, an original bit and its complement; optically storing a keyword to be retrieved from the plurality of keywords, the keyword to be retrieved being stored as two bits, an original bit and its complement; optically aligning the keyword to be retrieved with the plurality of keywords along an optical input path; illuminating the plurality of keywords through the keyword to be retrieved to generate bit-slice patterns representative of the combination of the keyword to be retrieved and the plurality of keywords; receiving the bit-slice patterns from the optical input path and shifting the bit-slice patterns by one or more of the original bit positions; and, directing shifted bit-slice patterns to the optical input path until all of the original bit positions of the plurality of keywords have been illuminated to identify one or more of the plurality of keywords as being the keyword to be retrieved.

In accordance with yet another aspect of the present invention, a method of operating an optical memory to perform bit-slice associative memory operations comprises the steps of: optically storing a plurality of keywords into a two-dimensional polarization changing storage device; optically storing a keyword to be retrieved from the plurality of keywords into a one-dimensional polarization changing storage device; providing a light polarizer; optically aligning the one-dimensional polarization changing device containing the keyword to be retrieved with the two-dimensional polarization changing device containing the plurality of keywords and the light polarizer along an optical input path; illuminating the light polarizer through the two-dimensional polarizing device containing the plurality of keywords and the one-dimensional polarizing device containing the keyword to be retrieved with a source of light polarized to correspond to the light polarizer to generate bit-slice patterns representative of the combination of the keyword to be retrieved and the plurality of keywords; receiving the bit-slice patterns from the optical input path and shifting the bit-slice patterns by one or more bit positions; and, directing shifted bit-slice patterns to the optical input path until all bit positions of the plurality of keywords have been illuminated to identify one or more of the plurality of keywords as being the keyword to be retrieved.

In accordance with another aspect of the present invention, an optical bit-slice associative memory comprises first optical storage means for storing a plurality of keywords. First keyword recall means provide for receiving a keyword to be retrieved from the first optical storage means, the first keyword recall means being optically aligned with the first optical storage means along a first optical path. Second optical storage means provide for storing a plurality of keywords which are the complements of the plurality of keywords stored in the first optical storage means. Second keyword recall means provide for receiving a keyword which is the complement of the keyword to be retrieved from the first optical storage means, the second keyword recall means being optically aligned with the second optical storage means along a second optical path. Optical shifter means included in a third optical path receive light from the first and second optical paths and feed back the light shifted by at least one optical bit position to the first and second optical paths. Output means associated with the third optical path provide for receiving a light output indicating the location within the first optical storage means of the keyword to be retrieved from the first optical storage means. Optical access means provide for accessing initially the first and second keyword recall means with subsequent bit-slices being taken via the feedback through the third optical path.

The optical bit-slice associative memory may further comprise optical data storage means for storing data uniquely associated with each of the plurality of keywords. For this embodiment, the optical data storage means is accessed by the light output indicating the location within the first optical storage means of the keyword to be retrieved from the first optical storage means to retrieve data associated with the keyword to be retrieved. Preferably, the first and second optical paths are connected substantially in parallel and the third optical path, including the optical shifter means, connects input and output ends of the first and second optical paths. The third optical path may include a spatial light modulator and a light source to thereby provide light amplification within the memory. The first and second storage means may each comprise a spatial light rebroadcaster.

In accordance with still another aspect of the present invention, an optical bit-slice associative memory comprises optical storage means for storing a plurality of keywords. Keyword recall means receive a keyword to be retrieved from the optical storage means. Optical access means provide for accessing the storage means through the keyword recall means to initiate a first bit-slice search of the plurality of keywords. The first bit-slice search produces a light pattern corresponding to the plurality of keywords at an output of the storage means. Optical shifter means receive a light pattern from the output of the storage means, shift the light pattern at least one bit position and feed back the light pattern shifted by at least one bit position to the keyword recall means. The optical shifter means thus repeatedly bit-slice searches the remaining columnar vectors of the plurality of keywords to identify the location within the optical storage means of the keyword to be retrieved therefrom.

In one embodiment, the optical storage means comprises first and second optical storage devices, the first optical storage device storing the plurality of keywords and the second optical storage device storing a plurality of keywords which are the complements of the plurality of keywords stored in the first optical storage device. The keyword recall means comprises first and second optical keyword recall devices, the first optical keyword recall device receiving a keyword to be retrieved from the first optical storage device and being optically aligned with the first optical storage device along a first optical path, the second optical keyword recall device receiving a keyword which is the complement of the keyword to be retrieved from the first optical storage means and being optically aligned with the second optical storage means along a second optical path. The first and second optical paths are connected effectively in parallel and the optical shifter means is connected into a third optical path connecting ends of the first and second optical paths. The third optical path includes a spatial light modulator and a light source to provide light amplification for the optical bit-slice memory, and the first and second optical storage devices each comprise a spatial light rebroadcaster.

In accordance with yet another aspect of the present invention, an optical bit-slice associative memory comprises optical storage means for storing a plurality of keywords, each bit of each of the keywords being stored as two bits, an original bit and its complement. Keyword recall means receive a keyword to be retrieved from the optical storage means, the keyword to be retrieved also being stored as two bits, an original bit and its complement. Optical access means provide for accessing the storage means through the keyword recall means to initiate a first bit-slice search of the plurality of keywords, the first bit-slice search producing a light pattern corresponding to the plurality of keywords at an output of the storage means. Optical shifter means receive a light pattern from the output of the storage means, shift the light pattern at least one original bit position and feed back the light pattern shifted by at least one original bit position to the keyword recall means thereby repeatedly bit-slice searching the remainder of the plurality of keywords to identify the location within the optical storage means of the keyword to be retrieved therefrom.

In accordance with a final aspect of the present invention, an optical bit-slice associative memory comprises polarization changing optical storage means for storing a plurality of keywords. Polarization changing keyword recall means receive a keyword to be retrieved from the polarization changing optical storage means. Polarizer means is provided for passing polarized light. Optical access means illuminate the polarizer means through the polarization changing storage means and the polarization changing keyword recall means to initiate a first bit-slice search of the plurality of keywords. The first bit-slice search produces a light pattern corresponding to the plurality of keywords at an output of the polarizer means. Optical shifter means receive a light pattern from the output of the polarizer means, shift the light pattern at least one bit position and feed back the light pattern shifted by at least one bit position to the polarization changing keyword recall means thereby repeatedly bit-slice searching the remainder of the plurality of keywords to identify the location within the polarization changing optical storage means of the keyword to be retrieved therefrom.

It is thus an object of the present invention to provide a method and apparatus for operating an optical computer to perform bit-slice associative memory operations; to provide a method and apparatus for operating an optical computer to perform bit-slice associative memory operations such that a keyword can be retrieved to access data associated with the keyword in an optical computer; to provide a method and apparatus for operating an optical computer to perform bit-slice associative memory operations including light amplification in a recirculating bit-slice loop; and, to provide a method and apparatus for operating an optical computer to perform bit-slice associative memory operations by identifying a keyword location within a plurality of keywords and using the located keyword to access data corresponding to that keyword.

Other objects and advantages of the invention will be apparent from the following description, the accompanying drawings and the appended claims.

DETAILED DESCRIPTION OF THE INVENTION

A popular method of searching for pattern matches is referred to as template matching or zero shift correlation. For the correlation method of searching, an input keyword is correlated with each of a plurality of keywords in a database and the keyword with the greatest correlation coefficient is used to identify the closest keyword in the database. The correlation method, also known as the winner-take-all method, is very difficult to perform optically because it requires an optical comparison circuit. Bit slice searching as performed by the present invention has the advantage of eliminating the optical comparison circuit as well as performing an exact match as opposed to a best match operation. Further, bit slice searching illuminates a column at a time as opposed to illuminating the entire two-dimensional storage device in the correlation method. Thus, the intensity of the light required for operation of the present invention is greatly reduced. While this increases the time required for the search, a substantial amount of that time can be recovered by performing pipeline operations.

Figure 1:
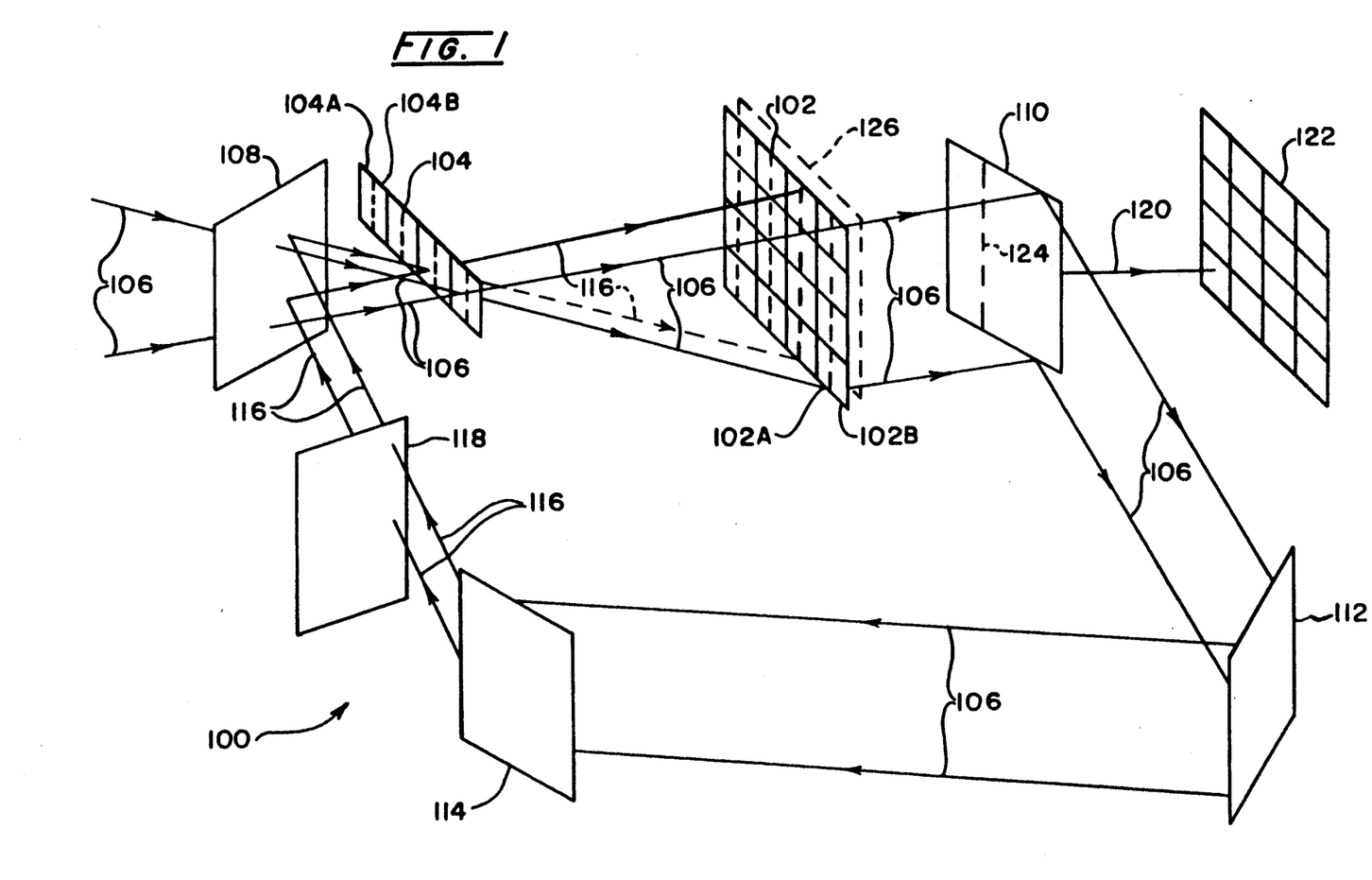
FIG. 1 is a schematic implementation of an optical memory illustrating the broadest aspects of operation of a bit-slice associative memory in accordance with the present invention.

Reference will now be made to FIG. 1 which illustrates the broadest aspects of the present invention by means of a schematic implementation of an optical memory 100 which is bit-slice searched. The memory 100 is constructed from currently available optical elements which include: lenses; mirrors; beam splitters; spatial light modulators (SLM's) such as liquid crystal devices wherein the transmittance or reflectance of pixels of the modulators can be electronically or optically controlled; and, spatial light rebroadcasters (SLR's) which are sensitive to different frequencies of light for writing/reading and luminesce upon being read. Alternate embodiments may utilize polarizers and polarization changing devices such as liquid crystal devices and magneto-optic devices. Additional optical elements are in the research and development stage and may further enhance the operation and reduce the expense of the memory 100 when ultimately perfected.

In the basic embodiment of FIG. 1, digitally represented keywords include "1," which will be presumed to be transparent in the optical devices employed, and "0's", which will be presumed to be opaque in the optical devices employed. Initially a plurality of keywords are loaded into rows of a two-dimensional SLM 102 and a keyword to be retrieved or the location of which is to be identified is loaded into a one-dimensional SLM 104. The least significant bit, rightmost bit, of the SLM 104 is initially illuminated by a light beam 106 through a beam splitter 108. The light beam 106 expands vertically on passing through the SLM 104 such that it illuminates the rightmost column of the SLM 102. For this simplified illustration, it is presumed that the search word or keyword to be retrieved is all "1's" so light passes through all cells of the SLM 104. Further, since one of the keywords in the SLM 102 is to match the search word, light will pass through the SLM 102 for each of the columns. The memory of FIG. 2 will provide for both "1's" and "0's" in the search word. Modifications of the optical memory 100 of FIG. 1 also will provide for both "1's" and "0's" for dual rail coding and polarization arrangements as will be described and other arrangements which will be apparent to those skilled in the art in view of this description.

In any event, in the illustration of FIG. 1, the output light from the rightmost column of the SLM 102 is passed to a beam splitter 110 which directs the light to a mirror 112. The mirror 112 passes the output light to a mirror 114 which serves as a light shifter by shifting the output light by one bit position to the left resulting in a shifted light beam 116. The shifted beam 116 passes through a concentrating lens 118 and includes the columnar pattern representative of the keyword bits contained in the rightmost column of the SLM 102 such that any "0's" contained in the rightmost column of the SLM 102 will be blanked out in the shifted beam 116. Thus, the output of the SLM 102 is shifted and fed back to sweep out the next column of the SLM 102 after passing through the SLM 104. The shifted light beam 116 including the modulation of the rightmost position of the SLM 104 and the rightmost column of the SLM 102 expands vertically due to the concentrating lens 118 to cover the second from the right column of the SLM 102.

This operation is repeated for three iterations such that the memory 100 is bit-slice searched for a keyword made up in this case of all "1's". For each such word, i.e. all "1's?, in the SLM 102, light will be passed from the leftmost column of the SLM 102. For the case where the keywords are unique such that there is only one keyword which matches the keyword to be retrieved, only one cell will be lighted in the last or leftmost column of the SLM 102. In FIG. 1 this is illustrated by the light beam 120 which can be used to access an optical store 122 which can be used to store data corresponding to the keyword to be retrieved. To this end, the beam splitter 110 may have the rightmost three columns masked for the light path to the optical store 122 as represented by the dotted line 124.

Figure 2:
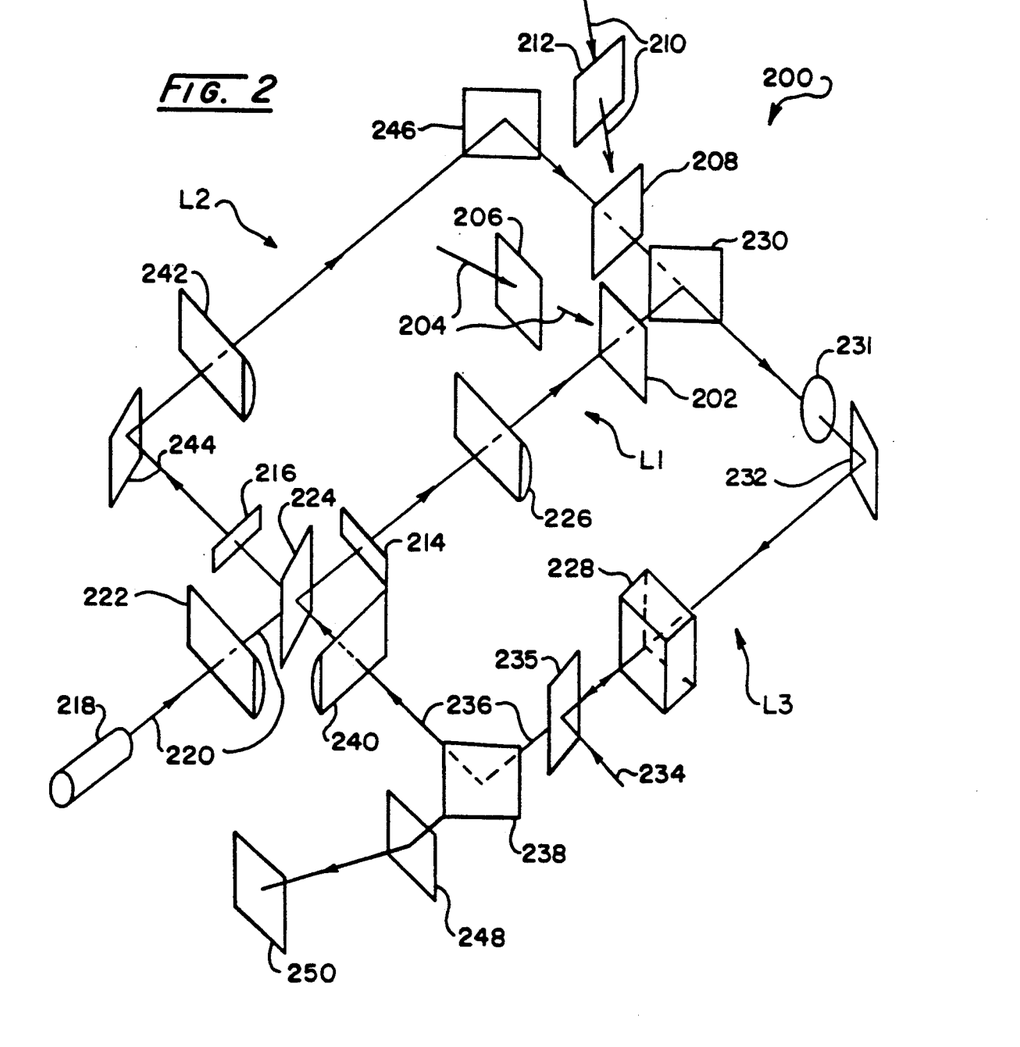
FIG. 2 is a schematic implementation of an optical memory operable in accordance with the present invention.

An optical memory 200 which is capable of searching for keywords including both "1's" and "0's" is illustrated in FIG. 2. In the memory 200, first optical storage means for storing a plurality of keywords comprises a spatial light rebroadcaster SLR 202. A keyword database is written into the SLR 202 using blue laser light 204 which is modulated to define the keyword database by passing through an electronically alterable SLM or ESLM 206 or otherwise. The keywords are written into the SLR 202 such that each word occupies a row of the SLR 202. The complement of the keyword database is written into second optical storage means which comprises a SLR 208 by means of blue laser light 210 which is modulated to define the complementary keyword database by passing through an ESLM 212 or otherwise. The complementary keywords are written into the SLR 208 such that each word occupies a row of the SLR 208.

An identifier keyword, which is to be retrieved or whose location in the SLR 202 is to be determined is entered into first keyword recall means which comprises an ESLM 214 in the illustrated embodiment. The complement of the keyword which is to be retrieved or whose location in the SLR 202 is to be determined is entered into second keyword recall means which comprises an ESLM 216 in the illustrated embodiment. Optical access means for accessing initially the first and second keyword recall means comprises a laser 218. The laser 218 is operated to provide a collimated infrared (IR) light beam 220 of a frequency that can read stored information out of the SLR's 202 and 208. The light beam 220 has a vertical spread, and in the horizontal direction it is narrow and in alignment with the leftmost bit or pixel of the ESLM 214. A cylindrical lens 222 focusses the light beam 220 onto the leftmost pixel of the ESLM 214 through a beam splitter 224. It is noted that it makes no difference whether you start with the leftmost or rightmost pixel, as long as the appropriate shift direction is used. Further, shifting could be by any appropriate number of bits as long as all bit positions are ultimately scanned or swept.

If the leftmost bit position or pixel of the ESLM 214 is set clear, i.e. a logical "1", the light beam 220 passes through the middle or first light path L1. After passing through the ESLM 214, the light beam 220 expands in the vertical direction as the result of the cylindrical lens 222 and is then collimated by a cylindrical lens 226. On striking the SLR 202, orange luminescence is generated at any point in the leftmost column that has stored data, i.e. is a logical "1", resulting in an output light column or column vector. This column vector of light is imaged onto an optically addressable spatial light modulator OSLM 228 by a beam splitter 230, a lens 231 and a mirror 232.

Coherent infrared light 234 is directed onto the front face of the OSLM 228 via a beam splitter 235 such that it is reflected to provide a coherent replica of the column vector in the form of an infrared light beam 236, which is needed for further operations within the memory 200. A beam splitter 238 is set so that the vertical column vector or light beam 236 is moved one column to the right of its original alignment. A cylindrical lens 240 focusses the light beam 236 onto the second leftmost bit position or pixel of ESLM 214 and ESLM 216 with the beam splitter 224 serving to properly direct the light beam 236 to this end.

If at any time a bit position or pixel of the ESLM 214 is opaque, then its complement on ESLM 216 will be transparent and the light beam 220 or 236 passes through the upper or second light path L2 rather than the center or first light path L1. After passing through the ESLM 216, the light beam 220 or 236 expands in the vertical direction as the result of the cylindrical lens 222 or 240, respectively, and is then collimated by a cylindrical lens 242 after being reflected by a mirror 244. The light beam 220 or 236 is directed by a mirror 246 to strike the SLR 208 such that orange luminescence is generated at any point in the corresponding column that has stored data, i.e. is a logical "1", resulting in an output light column or column vector. This column vector of light again is imaged onto an the optically addressable spatial light modulator OSLM 228 by the beam splitter 230, the lens 231 and the mirror 232.

Coherent infrared light 234 directed onto the front face of the OSLM 228 via the beam splitter 235 is reflected to provide a coherent replica of the column vector in the form of an infrared light beam 236, which is needed for further operations within the memory 200. The lens 231, the mirrors 232, 238, the OSLM 228, the beam splitter 235 and the cylindrical lens 240 form a third optical path L3 linking or interconnecting the outputs of the first and second optical paths L1, L2 to the inputs of the first and second optical paths L1, L2.

In this case, the column vector from the complement is fed back. This looping operation is repeated until light reaches the rightmost column in the feedback path. Only those rows of the database that exactly match the incoming keyword will have light in the last column at the rightmost column on the final feedback loop. By choosing unique keywords there will be only one spot of light in the rightmost column. The position of the spot in the vertical vector represents the number of the row corresponding to the matched word. The single beam may be used to retrieve data associated with the keyword and stored in optical data storage means 248 which comprises a like number of holograms. By illuminating one of the holograms an associated image is reconstructed at output reader 250.

Figure 3A:
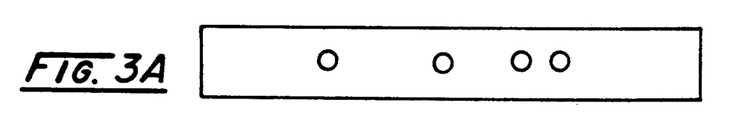
FIGS. 3A-3C show respectively, a keyword to be retrieved, a plurality of keywords making up a keyword database, and optical outputs from the memory of FIG. 2 generated in response to storage and retrieval using the illustrated keyword database and the keyword to be retrieved.
Figure 3B:
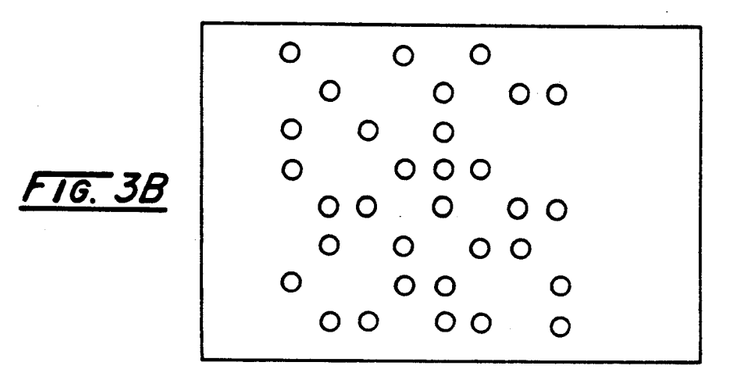
Figure 3C:
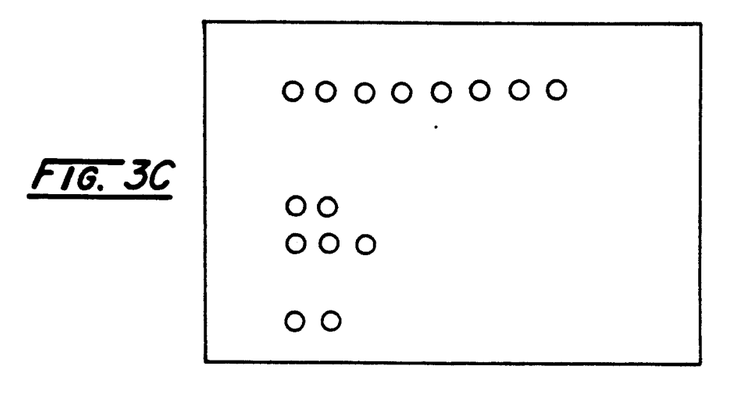

An example of the operation of the memory 200 will now be described with reference to FIGS. 3A–3C. In FIGS. 3A and 3B, the circles represent transparent regions of the ESLM 214 and locations of the SLR 202 which have "1's" stored therein. FIG. 3C illustrates the column vectors which are read from the SLR's 202 and 208. The keyword 01001011 shown in FIG. 3A is to be retrieved from the SLR 202 or the one or more storage locations in the SLR 202 are to be identified for retrieval of corresponding data as described. In the illustrated database of FIG. 3B, there is only one identical word which is stored in row 2 of the database. Thus, when the memory 200 is operated as described, matches result in multiple outputs through column 4 since several words have the same beginning bits. However, from column 5 to the end of the retrieval operation, the second row is the only row to continue to exhibit light generation from the SLR's 202 and 208.

The light generation for the remaining rows is stopped due to the blockage of the examining light source in any row which fails to match. Thus, the rightmost spot is illuminated in row 2 only, so that this illumination may be used to illuminate the associated optical data storage means 248 which comprises a holographic memory having holograms stored or positioned at each of the bit-slice search outputs. The use of SLR's may require image intensifiers because of their low output levels. However, in the illustrated embodiment of the memory 200 of FIG. 2, the light level is boosted for each loop by means of the coherent infrared light 234 which is directed upon the OSLM 228.

As previously mentioned, the optical memory 100 of FIG. 1 can be modified to provide for both "1's" and "0's" by using dual rail coding, polarization techniques or other arrangements which will be suggested to those skilled in the art in view of this detailed description. Such arrangements do not require a second optical path for the complements of the plurality of keywords and the keyword to be retrieved as in the embodiment of FIG. 2.

One such arrangement utilizes dual rail coding wherein each bit of both stored keywords and identifier keywords to be retrieved are replaced by a 2-bit code. For example, each "1" can be replaced by a "01" and each "0" can be replaced by a "10". Accordingly, a keyword "101" would become "011001". Operation of the memory 100 using dual rail coding is the same as previously described with reference to FIG. 1 except that the light beam 106 covers two pixels 102A, 102B and 104A, 104B as illustrated by the dotted vertical lines in the SLM 102 and the SLM 104 and shifting of the light beam is by one or more original bit positions, i.e. two bit positions to correspond to the 2-bit codes. Thus, the dual rail coding arrangement is equivalent to interleaving the columns of the keyword database and its complement. While avoiding the second optical path required for the embodiment of FIG. 2, the dual rail coding arrangement requires coding be performed before entering the keywords into the memory.

The use of complements of the keywords can be avoided altogether by using polarization techniques. For example, the storage means for the keywords and the keyword to be retrieved can be selected to be liquid crystal devices (LCD) or other polarization changing devices such as magneto-optic devices. For this arrangement, the SLM 102 is replaced by a polarization changing device as is the SLM 104.

The keyword to be retrieved is entered into a one-dimensional LCD, for example, and the plurality of keywords is entered into a two-dimensional LCD. The memory is accessed using polarized light, for example vertical polarized light. If a bit on the one-dimensional LCD is "0", there is no change in the polarization. Since any "0" bits in the two-dimensional LCD will also not change the polarization, the vertically polarized light will pass through an output polarizer 126 which is positioned behind the LCD taking the place of the SLM 102 and passes vertically polarized light.

If a bit on the one-dimensional LCD is "1", the LCD will change the polarization by 90°, or in this case from vertical polarization to horizontal polarization Since any "1" bits in the two-dimensional LCD will also change the polarization by 90°, the light will once again be vertically polarized and will pass through the output polarizer 126. However, if the bits on the one-dimensional LCD and the two-dimensional LCD differ from one another, the LCD having a "1" stored therein will change the polarization by 90° and the LCD having a "0" stored therein will effect no change in the polarization. Accordingly, the light will be horizontally polarized such that it is blocked by the vertical polarizer 126.

It should be apparent that the exact polarization orientation is unimportant as long as the polarizations along the path are coordinated or aligned with one another. While the polarization techniques require only one bit position or pixel per bit of stored keyword, there is no true "memory" as such in the system making synchronization difficult. However, memory can be added by inserting an SLR into the system.

While the method of operating an optical memory to perform bit-slice associate memory operations in accordance with the present invention should be apparent from the foregoing description, a brief description of that method will now be made to ensure clarity. The method comprises the steps of: storing a plurality of keywords in storage means for optically storing the plurality of keywords, the storage means comprising the SLR's 202 and 208 in the illustrated embodiment; identifying a keyword to be retrieved from the storage means with the keyword and its complement being stored in the ESLM's 214 and 216; illuminating a first bit-slice of the storage means in response to a corresponding first bit of the keyword to be retrieved to retrieve a corresponding bit-slice of the keywords stored in the storage means; shifting keyword bit-slices retrieved from the storage means and feeding the shifted bit-slices back to the storage means to illuminate all bit-slices of the optical storage means; and, identifying one or more locations of the optical storage means which contain the keyword to be retrieved from the final bit-slice retrieved from the optical storage means. The method may further comprise the step of accessing output data corresponding to the one or more locations of the storage means, for example by direct application of one or more optical readouts to a holographic store.

Preferably, the plurality of keywords stored in the storage means are unique such that only one location of the storage means is identified by the final keyword bit-slice retrieved from the storage means. The method may further comprise the step of accessing output data corresponding to the one location of the storage means. The step of illuminating a first bit-slice of the storage means is most easily performed by illuminating a first end bit-slice of the storage means and the step of shifting keyword bit-slices retrieved from the storage means and feeding the shifted bit-slices back to the storage means to illuminate all bit-slices of the optical storage means then comprises single bit-slice shifts toward a second end of the storage means. The storage means may comprise at least one spatial light rebroadcaster.

Having thus described the present invention in detail and by reference to preferred embodiments thereof, it will be apparent that modifications and variations are possible without departing from the scope of the invention defined in the appended claims.

What is claimed is:

1. A method of operating an optical memory to perform bit-slice associative memory operations comprising the steps of:
   storing a plurality of keywords in storage means for optically storing said plurality of keywords;
   identifying a keyword to be retrieved from said storage means;
   illuminating a first bit-slice of said storage means in response to a corresponding first bit of said keyword to be retrieved to retrieve a corresponding bit-slice of the keywords stored in said storage means;
   optically shifting keyword bit-slices retrieved from said storage means and feeding the shifted bit-slices back to said storage means to iteratively illuminate all bit-slices of said optical storage means in response to illumination of said first bit-slice of said storage means; and
   identifying one or more locations of said optical storage means which contain the keyword to be retrieved from the final bit-slice retrieved from said optical storage means.

2. A method of operating an optical memory to perform bit-slice associative memory operations as claimed in claim 1 wherein said plurality of keywords stored in said storage means are unique such that only one location of said storage means is identified by the final keyword bit-slice retrieved from said storage means.

3. A method of operating an optical memory to perform bit-slice associative memory operations as claimed in claim 2 further comprising the step of accessing output data corresponding to said one location of said storage means.

4. A method of operating an optical memory to perform bit-slice associative memory operations as claimed in claim 1 further comprising the step of accessing output data corresponding to said one or more locations of said storage means.

5. A method of operating an optical memory to perform bit-slice associative memory operations as claimed in claim 1 wherein the step of illuminating a first bit-slice of said storage means comprises illuminating a first end bit-slice of said storage means and the step of optically shifting keyword bit-slices retrieved from said storage means and feeding the shifted bit-slices back to said storage means to iteratively illuminate all bit-slices of said optical storage means in response to illumination of said first bit-slice of said storage means comprises single bit-slice shifts toward a second end of said storage means.

6. A method of operating an optical memory to perform bit-slice associative memory operation as claimed in claim 1 wherein said storage means comprises at least one spatial light rebroadcaster.

7. A method of operating an optical memory to perform bit-slice associative memory operations comprising the steps of:
   optically storing a plurality of keywords;
   optically storing a plurality of keywords which are the complements of said plurality of keywords;
   optically storing a keyword to be retrieved from said plurality of keywords;
   optically storing a keyword which is the complement of the keyword to be retrieved from said plurality of keywords;

optically aligning said keyword to be retrieved with said plurality of keywords along a first optical path;

optically aligning the complement of said keyword with the complements of said keywords along a second optical path;

illuminating said plurality of keywords through said keyword to be retrieved and the complement of said plurality of keywords through the complement of said keyword to be retrieved to generate bit-slice patterns representative of the combination of said keyword to be retrieved and said plurality of keywords;

receiving said bit-slice patterns from said first and second optical paths and optically shifting said bit-slice patterns by one or more bit positions; and directing optically shifted bit-slice patterns to said first and second optical paths until all bit positions of said plurality of keywords have been illuminated to identify one or more of said plurality of keywords as being the keyword to be retrieved.

8. A method of operating an optical memory to perform bit-slice associative memory operations as claimed in claim 7 wherein said plurality of keywords are unique such that only one of said keywords is identified.

9. A method of operating an optical memory to perform bit-slice associative memory operations as claimed in claim 8 further comprising the step of accessing output data corresponding to said one keyword.

10. A method of operating an optical memory to perform bit-slice associative memory operations as claimed in claim 7 further comprising the step of accessing output data corresponding to said one or more keywords.

11. A method of operating an optical memory to perform bit-slice associative memory operations comprising the steps of:

optically storing a plurality of keywords, each bit of each of said keywords being stored as two bits, an original bit and its complement;

optically storing a keyword to be retrieved from said plurality of keywords, said keyword to be retrieved being stored as two bits, an original bit and its complement;

optically aligning said keyword to be retrieved with said plurality of keywords along an optical input path;

illuminating said plurality of keywords through said keyword to be retrieved to generate bit-slice patterns representative of the combination of said keyword to be retrieved and said plurality of keywords;

receiving said bit-slice patterns from said optical input path and shifting said bit-slice patterns by one or more positions of said original bits; and directing shifted bit-slice patterns to said optical input path until all positions of said original bits of said plurality of keywords have been illuminated to identify one or more of said plurality of keywords as being the keyword to be retrieved.

12. A method of operating an optical memory to perform bit-slice associative memory operations comprising the steps of:

optically storing a plurality of keywords into a two-dimensional polarization changing storage device;

optically storing a keyword to be retrieved from said plurality of keywords into a one-dimensional polarization changing storage device;

providing a light polarizer;

optically aligning said one-dimensional polarization changing device containing said keyword to be retrieved with said two-dimensional polarization changing device containing said plurality of keywords and said light polarizer along an optical input path;

illuminating said light polarizer through said two-dimensional polarizing device containing said plurality of keywords and said one-dimensional polarizing device containing said keyword to be retrieved with a source of light polarized to correspond to said light polarizer to generate bit-slice patterns representative of the combination of said keyword to be retrieved and said plurality of keywords;

receiving said bit-slice patterns from said optical input path and optically shifting said bit-slice patterns by one or more bit positions; and directing optically shifted bit-slice patterns to said optical input path until all bit positions of said plurality of keywords have been illuminated to identify one or more of said plurality of keywords as being the keyword to be retrieved.

13. An optical bit-slice associative memory comprising:

first optical storage means for storing a plurality of keywords;

first keyword recall means for receiving a keyword to be retrieved from said first optical storage means, said first keyword recall means being optically aligned with said first optical storage means along a first optical path;

second optical storage means for storing a plurality of keywords which are the complements of the plurality of keywords stored in said first optical storage means;

second keyword recall means for receiving a keyword which is the complement of the keyword to be retrieved from said first optical storage means, said second keyword recall means being optically aligned with said second optical storage means along a second optical path;

optical shifter means included in a third optical path for receiving light from said first and second optical paths and feeding back said light shifted by at least one optical bit position to said first and second optical paths;

output means associated with said third optical path for receiving a light output indicating the location within said first optical storage means of said keyword to be retrieved from said first optical storage means; and optical access means for accessing initially said first and second keyword recall means.

14. An optical bit-slice associative memory as claimed in claim 13 further comprising optical data storage means for storing data uniquely associated with each of said plurality of keywords, said optical data storage means being accessed by the light output indicating the location within said first optical storage means of said keyword to be retrieved from said first optical storage means to retrieve data associated with said keyword to be retrieved.

15. An optical bit-slice associative memory as claimed in claim 13 wherein said first and second optical paths are connected effectively in parallel and said third optical path including said optical shifter means connects input and output ends of said first and second optical paths.

16. An optical bit-slice associative memory as claimed in claim 13 wherein said third optical path includes a spatial light modulator and a light source.

17. An optical bit-slice associative memory as claimed in claim 13 wherein said first and second storage means each comprise a spatial light rebroadcaster.

18. An optical bit-slice associative memory comprising:
- optical storage means for storing a plurality of keywords;
- keyword recall means for receiving a keyword to be retrieved from said optical storage means;
- optical access means for accessing said storage means through said keyword recall means to initiate a first bit-slice search of said plurality of keywords, said first bit-slice search producing a light pattern corresponding to said plurality of keywords at an output of said storage means; and
- optical shifter means for receiving a light pattern from the output of said storage means, optically shifting said light pattern at least one bit position and feeding back said light pattern optically shifted by at least one bit position to said keyword recall means thereby repeatedly bit-slice searching the remainder of said plurality of keywords to identify the location within said optical storage means of said keyword to be retrieved therefrom.

19. An optical bit-slice associative memory as claimed in claim 18 wherein said optical storage means comprises first and second optical storage devices, said first optical storage device storing said plurality of keywords and said second optical storage device storing a plurality of keywords which are the complements of the plurality of keywords stored in said first optical storage device; and, said keyword recall means comprises first and second optical keyword recall devices, said first optical keyword recall device receiving a keyword to be retrieved from said first optical storage device and being optically aligned with said first optical storage device along a first optical path, said second optical keyword recall device receiving a keyword which is the complement of the keyword to be retrieved from said first optical storage means and being optically aligned with said second optical storage means along a second optical path.

20. An optical bit-slice associative memory as claimed in claim 19 wherein said first and second optical paths are connected substantially in parallel and said optical shifter means is connected into a third optical path connecting ends of said first and second optical paths.

21. An optical bit-slice associative memory as claimed in claim 20 wherein said third optical path includes a spatial light modulator and a light source.

22. An optical bit-slice associative memory as claimed in claim 21 wherein said first and second optical storage devices each comprise a spatial light rebroadcaster.

23. An optical bit-slice associative memory comprising:
- optical storage means for storing a plurality of keywords, each bit of each of said keywords being stored as two bits, an original bit and its complement;
- keyword recall means for receiving a keyword to be retrieved from said optical storage means, said keyword to be retrieved being stored as two bits, an original bit and its complement;
- optical access means for accessing said storage means through said keyword recall means to initiate a first bit-slice search of said plurality of keywords, said first bit-slice search producing a light pattern corresponding to said plurality of keywords at an output of said storage means; and
- optical shifter means for receiving a light pattern from the output of said storage means, shifting said light pattern at least one original bit position and feeding back said light pattern shifted by at least one original bit position to said keyword recall means thereby repeatedly bit-slice searching the remainder of said plurality of keywords to identify the location within said optical storage means of said keyword to be retrieved therefrom.

24. An optical bit-slice associative memory comprising:
- polarization changing optical storage means for storing a plurality of keywords;
- polarization changing keyword recall means for receiving a keyword to be retrieved from said polarization changing optical storage means;
- polarizer means for passing polarized light;
- optical access means for illuminating said polarizer means through said polarization changing storage means and said polarization changing keyword recall means to initiate a first bit-slice search of said plurality of keywords, said first bit-slice search producing a light pattern corresponding to said plurality of keywords at an output of said polarizer means; and
- optical shifter means for receiving a light pattern from the output of said polarizer means, optically shifting said light pattern at least one bit position and feeding back said light pattern optically shifted by at least one bit position to said polarization changing keyword recall means thereby repeatedly bit-slice searching the remainder of said plurality of keywords to identify the location within said polarization changing optical storage means of said keyword to be retrieved therefrom.

* * * * *